Oct. 5, 1954 L. M. MINSK ET AL 2,690,966

PHOTOMECHANICAL RESIST

Filed Jan. 20, 1951

LOUIS M. MINSK
WERTER P. VAN DEUSEN
INVENTORS
Daniel J. Mayne
BY W. H. McDowell
ATTORNEY & AGENT Patented Oct. 5, 1954 2,690,966

UNITED STATES PATENT OFFICE 2,690,966

PHOTOMECHANICAL RESIST

Louis M. Minsk and Werter P. Van Deusen, Rochester, N. Y., assignors to Eastman Kodak Company, Rochester, N. Y., a corporation of New Jersey Application January 20, 1951, Serial No. 207,048

15 Claims. (Cl. 95—7)

Figures 1, 2, 3, 4:
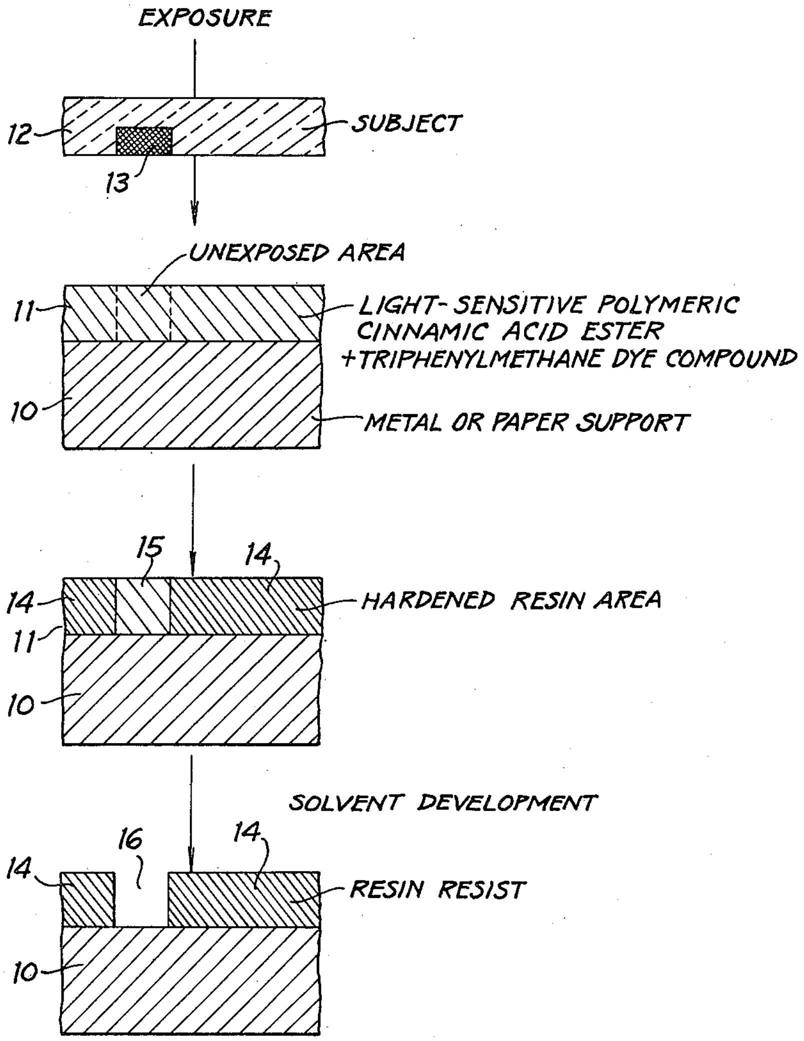

This application is a continuation-in-part of our application Serial No. 58,084 filed November 3, 1948, now abandoned.

This invention relates to methods of making photographic relief images of particular use as resists for printing plates.

It is well known in the art of photomechanical reproduction to utilize various materials such as bichromated shellac, albumen or polyvinyl alcohol for forming resist images upon various supports such as metal plates. The support is then etched or otherwise treated in the areas not covered by the resist image and the resultant plate, usually after removal of the resist image, is used for printing. One method of forming relief images on metal supports is disclosed in the Murray U. S. Patent 1,965,710, granted July 10, 1934, and includes using as a sensitive layer for forming a resist image, a layer of a cinnamal ketone plus a polymeric material which, after exposure under a design, may be selectively dissolved in the unexposed area whereby the area of the support thus bared may be etched.

We have discovered certain polymeric materials which are light-sensitive and have properties superior to the mentioned bichromated materials or cinnamal ketones. Therefore, one object of our invention is to provide superior light-sensitive materials of use in making resists for printing plates. Another object is to provide light-sensitive elements and intermediate printing plates provided with resist images adapted to making final printing forms. Another object is to provide methods of making photographic relief images from the light-sensitive polymeric materials. A further object is to provide a method of increasing the light-sensitivity of the polymeric materials of the invention. Other objects of our invention will appear from the following description.

The objects of our invention are accomplished in part by using as light-sensitive coatings for printing plates, cinnamic acid esters of polyvinyl alcohol and cellulose as well as of partially alkylated cellulose or polyvinyl alcohol, either completely or partially hydroxy alkylated celluose or polyvinyl alcohol, and partially esterified cellulose or polyvinyl alcohol. Other useful polymeric materials containing cinnamoyl groups are disclosed in the Allen et al. U. S. patent application Serial No. 771,142, filed August 28, 1947, now U. S. Patent 2,566,302, granted September 4, 1951, e. g., cinnamoylated polystyrene resins. Such coatings are exposed in the usual manner to line or halftone subjects and after exposure are treated with a solvent to remove the coating in the unexposed area of the plate and an intermediate plate is thus obtained provided with a resinous resist image useful in a variety of processes to form final printing plates.

Our objects are further accomplished by using a triphenyl methane dye as a light-sensitizing agent for the polymeric material.

In the accompanying drawings, the various figures show in enlarged cross-sectional view the structure of a representative sensitive element of our invention at various stages in the process of producing intermediate printing plates having selected areas covered by polymeric resist images.

The preferred light-sensitive polymeric materials of the invention are obtained by esterification of hydroxy-containing polymeric materials such as starch, cellulose or polyvinyl alcohol with a cinnamic acid halide such as ordinary cinnamic acid, α-phenyl, β-phenyl, o-chloro, or m-nitro cinnamic acid chlorides as follows:

POLYVINYL CINNAMATE

Eleven grams of a polyvinyl alcohol were heated overnight on a steam bath with 100 cc. of pyridine, 100 cc. of pyridine were then added and the suspension cooled at 50° C. Fifty grams of a commercial grade of cinnamoyl chloride were then added portionwise with agitation during which time some heat was evolved and a precipitate formed. The reaction mixture was then heated at 50° C. under a condenser provided with a calcium chloride tube, and after four hours, during which time the suspension was occasionally agitated, a viscose dope was obtained. Dilution of the dope with acetone was followed by filtration and precipitation in water. The resultant resin was purified by extensive washing with water until free from chloride and then dried. A yield of 31.5 grams of polyvinyl cinnamate was obtained. Another batch of polyvinyl cinnamate made by the same method but using 300 times the amount of reactants yielded 25.5 pounds of the resin having an analysis indicating that the method was productive of polyvinyl cinnamate containing 99.4 mol per cent combined vinyl cinnamate. In a similar manner, the resin may be esterified to a lesser extent by reducing the amount of acid chloride used and carefully controlling the conditions of esterification. However, it is necessary to esterify the resin to the point at which it becomes soluble in the solvent to be used for selectivity developing the resist-image, and generally, if the polymer is at least 60 mol per cent esterified, it is satisfactory. The sensitivity of the resin may in effect be varied by variation in molecular weight of the resins since the low molecular weight short chain polymers appear to require more exposure than do the higher polymers to obtain clean resists on development.

While the most useful polymeric materials may contain from about 60 to 100 mol per cent of vinyl cinnamate, the preferred polymers contain about 87 to 100 mol per cent vinyl cinnamate because such polymers possess the combination of properties of maximum resistance to moisture and accordingly, maximum attraction for greasy printing inks, and since such polymers are highly soluble in organic solvents, clean resists are obtained in the organic solvent development step. Esterification of cellulose with the acid chlorides is carried out to the extent indicated in a comparable manner by treating the cellulose fiber or partially esterified cellulose esters with the desired acid chloride under conditions similar to the above.

A preferred hydrolysis method for making cinnamic acid esters of polyvinyl alcohol containing less than 100 mol. per cent vinyl cinnamate is given as follows:

100 grams of the polyvinyl cinnamate prepared as above were dissolved in 500 cc. of 1,4-dioxane and 200 cc. of methanol, followed by the addition of 1 gram of metallic sodium in 100 cc. of methanol. 300 cc. of 1,4-dioxane were then added with stirring until the mixture was homogeneous. Samples were then removed at intervals, precipitated in distilled water, washed with water until free of alkali and then dried under vacuum. Samples taken at the intervals had the analysis shown in the following table based on carbon analyses.

| Sample No. | Sampling Interval (Min.) | Vinyl Cinnamate (Wt. Per-cent) | Vinyl Cinnamate (Mol. Per-cent) |
|---|---|---|---|
| 1 | 5 | 96.9 | 90.5 |
| 2 | 12 | 96.4 | 89.0 |
| 3 | 17 | 94.8 | 87.5 |
| 4 | 24 | 90.6 | 74.2 |
| 5 | 31 | 85.8 | 64.3 |
| 6 | 44 | 83.2 | 59.6 |

By the term "polyvinyl cinnamate" we mean to include only organic solvent soluble esters of polyvinyl alcohol containing from about 60 to 100 mol per cent of combined vinyl cinnamate groups, the balance being vinyl alcohol groups. Polyvinyl cinnamate of the insoluble type obtained by polymerization of vinyl cinnamate is not contemplated for use in our invention. Accordingly, polyvinyl cinnamates of our invention contain from about 60 to 100 mol percent of recurring structural units having the formula $$-CH_2-\overset{|}{C}H-O-CO-CH=CH-C_6H_5$$

the balance of the structural units in the polymer being vinyl alcohol groups.

By the term "cinnamic acid esters of polyvinyl alcohol and cellulose" we mean organic solvent soluble esters containing from about 60 to 100 mol per cent of combined cinnamyl ester groups. This includes simple as well as mixed esters, e. g., polyvinyl acetate cinnamates and cellulose acetate cinnamates, containing at least 60 mol per cent cinnamyl ester and the balance comprising a different acyl group or being unesterified or both. Accordingly, a group of cinnamic acid esters of polyvinyl alcohol used in our invention contain at least 60 mol percent of recurring structural units having the formula $$-CH_2-\overset{|}{C}H-O-CO-CH=CH-R$$

wherein R represents a phenyl, m-nitrophenyl, o-chlorophenyl group, etc., the remaining structural units being vinyl alcohol groups.

By the term "resist composition" as used herein and in the appended claims, we mean a system containing as its essential ingredients one of the polymeric cinnamic acid esters and one of the sensitizing agents of the invention, either as a solid mixture of chemicals, for example, as in a coating, or as a mixture of chemicals in an organic solvent solution.

A typical resist lacquer useful for forming resist images on printing plates is compounded of the following materials.

| | | |
|---|---|---|
| Polyvinyl cinnamate | grams | 5 |
| Crystal violet carbinol base | do | 0.25 |
| Xylene | cc | 40 |
| Toluene | cc | 40 |
| n-Butyl alcohol | cc | 10 |
| i-Propyl alcohol | cc | 10 |

If desirable, the solvents in the above formula can be replaced wholly by methyl glycol acetate or a mixture of this solvent together with isopropyl alcohol, xylene-chlorobenzene (3 to 1 by volume), or any of the solvents or solvent combinations disclosed in the Minsk, Van Deusen and Robertson application Serial No. 207,050 filed concurrently.

When using a m-nitrocinnamate such as polyvinyl m-nitrocinnamate, we prefer to disperse the resin together with the dye in nitrobenzene. The coatings made from this solution are preferably developed with nitrobenzene at a temperature of about 110° F. for about 1 minute. When using the cellulose cinnamates, it is preferable to disperse the ester in 1,4-dioxane for coating, and develop the resist image in 1,4-dioxane.

We have found that it is not necessary to incorporate a dye into a lacquer formula used for coating a light-sensitive printing element, inasmuch as the cinnamic acid esters are inherently light-sensitive and a printing plate can be obtained therefrom by merely exposing a layer of the resin under a pattern and washing out the unexposed area with a solvent. However, the dye in the above coating formula serves a dual purpose. The dye functions as a coloring material for the lacquer, some of which coloring material is retained in the subsequently developed resist image and improves the visibility of the image on the printing plate. More important, we have discovered that when a triphenyl methane dye such as Crystal Violet is incorporated into a coating of the cinnamic acid esters of the invention, the light-sensitivity of the coating is measurably increased. That is, the addition of as little as 2 to 25 per cent, preferably 10 per cent, of the weight of the polymeric material, of the dye, to a coating formula initially increases the light-sensitivity of the resultant coatings from a value of 2 to 10. Moreover, we have found that if the dye is incorporated into the solvent composition containing the cinnamic acid ester, particularly polyvinyl cinnamate, and the liquid composition is allowed to age for a matter of several days, the light-sensitivity of the composition will be found to have increased to a speed value of the order of 250. Furthermore, the rate of increase in speed of the composition containing the dye can be accelerated by aging the composition at room temperature but preferably at elevated temperatures and/or in the presence of a stable peroxide compound. In absence of the dye the peroxides are not effective in increasing speed.

The following dyes are given as examples of typical triphenyl methane dyes useful as sensitizing agents for the cinnamic acid esters of our invention, and possess the structure

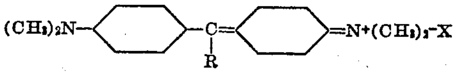

for example:

Crystal Violet (Schultz No. 785)—10, where R is

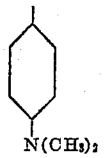

Chrome Green Powder (Schultz No. 772)—9, where R is

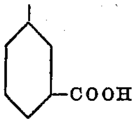

Malachite Green (Schultz No. 754)—10, where R is

Victoria Blue B (Schultz No. 822)—5, where R is

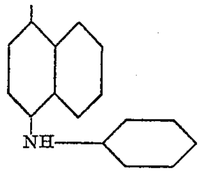

Rhoduline Blue 3G—5, where R is

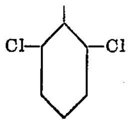

Azo Green TIEG (Schultz No. 773)—4, where R is

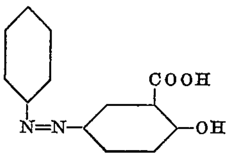

Pararosaniline itself is a sensitizer imparting an initial speed of 5.

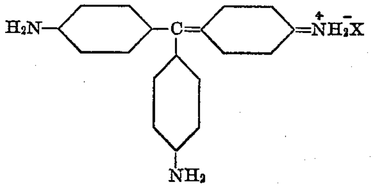

Examples of other triphenylmethane dyes which initially do not materially increase the light sensitivity of the compositions but which do give substantial speed increases on aging alone or in the presence of peroxide are the following:

Methyl Violet (Schultz No. 783)—3, where R is

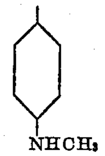

Turkish Blue (Schultz No. 779)—5, where R is

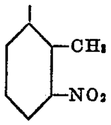

Rhoduline Blue 6GA, where R is

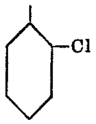

New Fuchsin (Schultz No. 782)

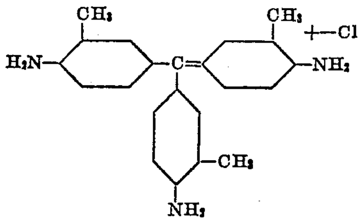

Chrome Violet (Schultz No. 846)

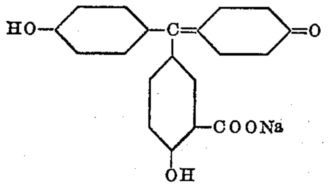

Rhoduline Blue 5BA

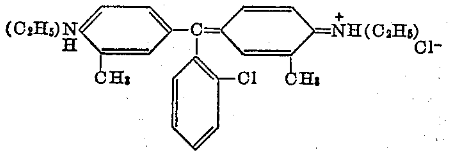

Aurin (Schultz No. 843)

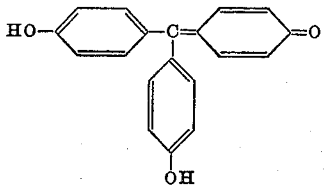

Spirit Blue (Schultz No. 792)

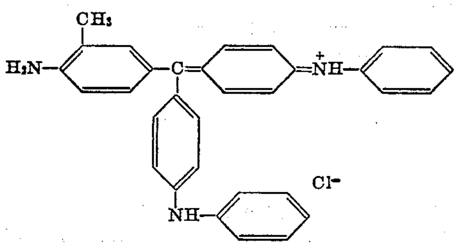

Triphenylmethane

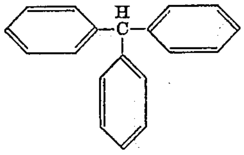

The number following the name of each compound represents the light-sensitivity of a coating of polyvinyl cinnamate (99.4 mol. per cent vinyl cinnamate) containing the dye, not aged, relative to a value of 2 for the unsensitized resin. Similar speed values are obtained with coatings of the other cinnamic acid esters containing the dyes. The data was obtained from coatings containing 10 per cent dye based upon the weight of resin present.

The sensitizing agents for the photomechanical resist compositions of the invention are classifiable as triphenyl methane dyes having the following general structure:

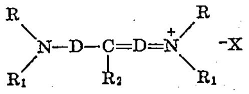

wherein R and $R_1$ each represents an alkyl group such as methyl or ethyl, or a hydrogen group, or phenyl group where R is hydrogen, $R_2$ represents an aryl group of the benzene and naphthalene series substituted or not, D represents an arylene group of the benzene series substituted or not, and X represents an acid group such as chloride, bromide, iodide, acetate, oxalate, etc. We have found that it is not at all critical whether the dye is utilized as a sensitizing agent in the salt form or in the carbinol form of the dye. Sensitization of the order indicated above is obtainable using either form of the dye; however, we prefer to select that form of a particular dye which is more soluble in the particular solvent being used for making up the coating composition. It has been noted that during the aging of compositions initially containing the carbinol or salt forms of the dyes, the composition gradually loses color. The mechanism of the sensitizing effect is otherwise not understood.

A preferred group of triphenyl methane dyes falling within the above general structure have the following structure:

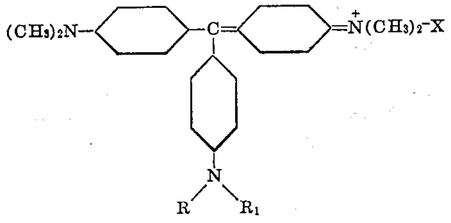

wherein X is an acid group such as mentioned, and R and $R_1$ each represent hydrogen or methyl groups. The carbinol form of the dyes is also useful.

Other preferred dyes useful in our invention have the following general formula:

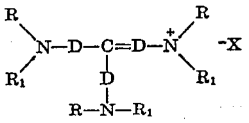

wherein R and $R_1$ represent hydrogen, and an aryl group of the benzene series when R is hydrogen, D represents an arylene group of the benzene series, substituted or not, and X is an acid group such as chlorine or bromine. In the three formulas immediately above the aryl group may further be substituted, for example, with an alkyl group such as methyl, and the carbinol form of the dyes are likewise useful.

The following table illustrates the mentioned effect of aging a xylene-chlorobenzene (3 to 1) solution of polyvinyl cinnamate containing 2.5 per cent of the resin, and 10 per cent of the dye indicated alone or in the presence of peroxide, at 120° F.

*Table.—Speed*

| Compound | Without Peroxide, days | | | | | With Peroxide, days | | | | |
|---|---|---|---|---|---|---|---|---|---|---|
| | 0 | 3 | 7 | 14 | 21 | 0 | 3 | 7 | 14 | 21 |
| Malachite Green | 10 | 10 | 10 | 10 | 10 | 10 | 40 | 40 | 40 | 40 |
| Victoria Blue | 5 | 20 | 40 | 40 | 40 | 10 | 70 | 70 | 70 | 70 |
| Rhoduline Blue 6GA | 2 | 3 | 3 | 3 | 3 | 4 | 10 | 10 | 10 | 10 |
| Methyl Violet | 3 | 4 | 4 | 4 | 4 | 10 | 40 | 40 | 40 | 40 |
| Crystal Violet—XC | 15 | ---- | 100 | 180 | ---- | 120 | ---- | 250 | 250 | ---- |
| Crystal Violet—MGA | 15 | ---- | 20 | ------ | ---- | 55 | ---- | ------ | ------ | 75 |

The peroxide used was 1-hydroxycyclohexyl hydroperoxide. The amount of peroxide used can vary, however it is satisfactory to use as much as 10–15 per cent of the compound based on weight of resin. In the above aging series the Crystal Violet dye appears most outstanding. However, the apparent higher sensitivity conferred by the dye is believed to be due to the fact this dye had been more highly purified than the other dyes. This is borne out by the fact that sensitivity increases with dye concentration, an amount of dye of the order of from 5 to 25 per cent, based upon weight of cinnamic acid ester, being most useful.

The peroxide compounds useful in aging the compositions are relatively stable compared to peroxides such as benzoyl peroxide. The latter is not useful because it causes insolubilization of the resin immediately after incorporation into the solvent system containing resin and dye. The preferred peroxides are "peresters" of aromatic acids e. g. benzoic and phthalic acids. t-Butyl perbenzoate $C_6H_5—CO—OOC(CH_3)_3$ and di-t-butyl diperphthalate $$C_6H_5[CO—OOC(CH_3)_3]_2$$

are particularly useful. 1-hydroxycyclohexyl hydroperoxide-1 $C_6H_{10}(OH)OOH$ is also very effective. These peroxides have the property of losing available oxygen very slowly over a period of time, and have been found to be substantially free of decomposition when heated for as long as 58 hours at 75° C. Similarly loss of oxygen by storage of the compounds at room temperature for one year is of the order of 0.2% of the available oxygen. Accordingly, by "stable peroxides" we mean those peroxides substantially free of loss of available oxygen over the periods and under the conditions of the order indicated.

Another feature of our invention resides in the solvent used in the compositions which are aged to increase their light-sensitivity. That is, the dye identified in Table 1 as "Crystal Violet—MGA" was actually the same as that carrying the name "Crystal Violet—XC." The difference in the tests was that methyl glycol acetate was used as solvent in the first case and the xylene-chlorobenzene mixture in the other. It is apparent from the data that the latter solvent more readily accelerates aging whether peroxide is present or not. Similar results can be expected with other solvents.

The initial sensitivity as well as the rate of increase of sensitivity with aging, varies inversely as the concentration of polymeric material and sensitizer in the solvent. That is, in a typical case, several compositions were made in xylene-chlorobenzene containing 2.5, 5, 7.5 and 10 per cent polyvinyl cinnamate (fully esterified), each containing 10 per cent Crystal Violet (based on resin). The initial sensitivities of the samples were 40, 30, 20 and 15, respectively, and after aging 3 weeks at 120° F. the respective speed values were 200, 90, 50 and 20.

The concentration of peroxide in the solvent compositions also affects initial speed and rate of aging. Compositions, for example, containing 0, 5 and 10 per cent of 1-hydroxycyclohexyl hydroperoxide-1, 2.5 per cent polyvinyl cinnamate and 10 per cent Crystal Violet dye, initially have speeds of 30, 125 and 250 respectively. Aging does not appreciably increase the speed of the sample containing 10 per cent peroxide but the sample containing 5 per cent peroxide increased in speed more rapidly on aging than did the sample containing no added peroxide.

Our invention will be understood by consideration of the accompanying drawings and the following examples illustrating various means of employing the light-sensitive polymeric materials for forming resist images and printing plates therefrom.

EXAMPLE

In this and the following examples, the general method of coating the support with the lacquer, exposing and developing the resist image includes the following steps: the lacquer is whirled on the plate or other support at a speed of approximately 50–80 R. P. M. or if desired, by machine coating methods, and the coating is dried at room temperature or elevated temperature in subdued light. The resulting coatings possess a speed of the order of that of bichromated glue or albumen and are exposed under an image such as a line or halftone negative for a minute to 1½ minutes at one foot from a 35-ampere white flame arc, and after exposure, preferably in vacuum contact with the subject, are developed by washing in a tray or tank of a hydrocarbon such as benzene with gentle agitation for one-half to 3 minutes depending on the thickness of the coating. Other solvents or solvent combinations may be used for development such as are indicated in the mentioned co-pending application, for example, mixtures of xylene and an acidic compound; xylene and isopropyl alcohol together with an acidic compound. Generally, it is not necessary to rub the coating during the development step in order to produce a relief image and ordinarily prolonged treatment with the hydrocarbon developer does no harm.

When applying the above procedure to making etched zinc halftone images, the above type of lacquer was coated on a degreased photoengraving zinc plate, dried, exposed, developed and etched for 4 minutes with 15 per cent nitric acid solution, to which a wetting agent had been added, to obtain a relief plate. The plate was then rubbed to remove the resist. The removal of the resist is aided by use of a solvent such as benzene or acetone.

The procedure described is illustrated in the accompanying drawings wherein Fig. 1 shows the subject 12, containing the opaque image 13. The exposing light passing through the subject selectively exposes the light-sensitive element of Fig. 2 having a metal support 10 such zinc or copper, carrying the light-sensitive layer 11 of the invention. The result of exposure in the selective areas is shown in Fig. 3 wherein the layer 11 now contains areas 14 which are hardened or less soluble in solvents while the unexposed area 15 is unchanged. During treatment of the element shown in Fig. 3 with a hydrocarbon developer area 15 dissolves leaving resin resist 14 on the support and areas 16 of the support are bared, as shown in Fig. 4. The intermediate printing plate thus obtained can be further treated as in the above example and other types of printing plates may be produced using the sensitive compositions of our invention applied to various supports and processing the exposed elements as described in our parent application or the mentioned co-filed application.

We have noted that in general the azo dyes are poor sensitizers for the polymeric materials of the invention. Only two dyes have been found which impart a sensitivity of the order of 50 to the polyvinyl cinnamate resin. These were 2,4,6 - trinitrobenzeneazo - p - (1 - glyceryl - 4 - methyltetrahydroquinoline) and 2,4,6-trinitrobenzeneazo - p - (1 - glyceryl - 2 - methyldihydro-1,4-benzoxazine). Speed of the order indicated was obtained without aging the composition containing the dye. No other azo dyes tested yielded speeds over 3 to 10 and aging did not increase the speed of compositions containing azo dyes.

What we claim is:

1. A photomechanical resist composition comprising a polymeric material selected from the group consisting of cinnamic acid esters of polyvinyl alcohol containing at least 60 mol percent of recurring structural units having the formula $$-CH_2-\overset{|}{C}H-O-CO-CH{=}CH-C_6H_5$$

as a combined carrier and light-sensitive material, and as a light-sensitizing agent for the polymeric material a triphenylmethane dye containing at least one 4-aminophenyl group attached directly to the methane carbon atom of said dye.

2. A photomechanical resist composition comprising the ester of polyvinyl alcohol set forth in claim 1 as a combined carrier and light-sensitive material, and as a sensitizing agent for the ester a triphenylmethane dye containing at least one 4-alkylaminophenyl group attached directly to the methane carbon atom of said dye.

3. A photomechanical resist composition comprising the ester of polyvinyl alcohol set forth in claim 1 as a combined carrier and light-sensitive material, and as a sensitizing agent for the ester a triphenylmethane dye containing at least one 4-dialkylaminophenyl group attached directly to the methane carbon atom of said dye.

4. A photomechanical resist composition comprising the ester of polyvinyl alcohol set forth in claim 1 as a combined carrier and light-sensitive material, and as a sensitizing agent for the ester a 4,4',4''-triaminotriphenylmethane dye.

5. A photomechanical resist composition comprising the ester of polyvinyl alcohol set forth in claim 1 as a combined carrier and light-sensitive material, and as a sensitizing agent for the ester a triphenylmethane dye selected from those having the general structure

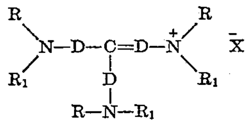

wherein R and $R_1$ each represents a member selected from the group consisting of hydrogen, and an aryl group of the benzene series when R is hydrogen, D represents an arylene group of the benzene series, and X represents an acid group, and the carbinol form of said dye.

6. A photomechanical resist composition comprising the ester of polyvinyl alcohol set foth in claim 1 as a combined carrier and light-sensitive material, and as a light-sensitizing agent for the polyvinyl cinnamate, a triphenylmethane dye selected from those having the general structure

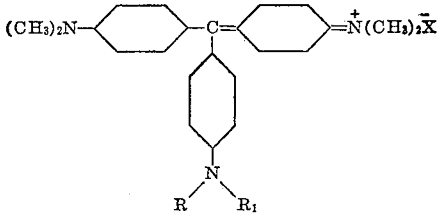

wherein X represents an acid group and R and $R_1$ each are selected from the group consisting of hydrogen and methyl, and the carbinol form of said dye.

7. A photomechanical resist composition comprising the ester of polyvinyl alcohol set forth in claim 1 as a combined carrier and light-sensitive material, and as a light-sensitizing agent for the polyvinyl cinnamate, a triphenylmethane dye selected from those having the general structure

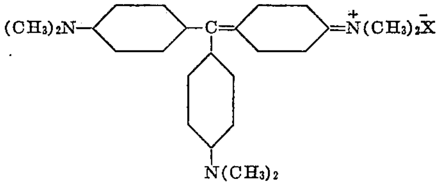

wherein X is a halogen atom, and the carbinol form of said dye.

8. A photomechanical resist composition comprising the ester of polyvinyl alcohol set forth in claim 1 as a combined carrier and light-sensitive material, and as a light-sensitizing agent for the polyvinyl cinnamate, a triphenylmethane dye selected from those having the general structure

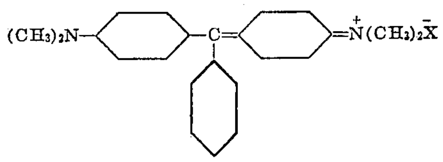

wherein X is a halogen atom, and the carbinol form of said dye.

9. A photomechanical resist composition comprising the ester of polyvinyl alcohol set forth in claim 1 as a combined carrier and light-sensitive material, and as a light-sensitizing agent for the polyvinyl cinnamate, a triphenylmethane dye selected from those having the general structure

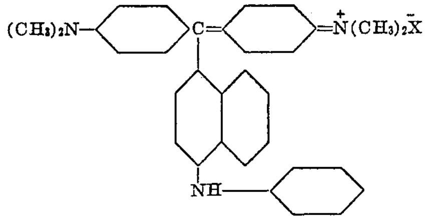

wherein X is a halogen atom, and the carbinol form of said dye.

10. A photomechanical resist composition comprising the ester of polyvinyl alcohol set forth in claim 1 as a combined carrier and light-sensitive material, and as a light-sensitizing agent for the polyvinyl cinnamate, a triphenylmethane dye selected from those having the general structure

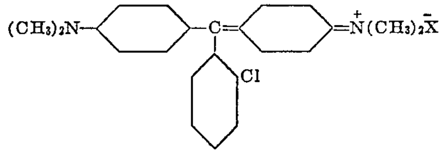

wherein X is a halogen atom, and the carbinol form of said dye.

11. A photomechanical resist composition comprising of the ester of polyvinyl alcohol set forth in claim 1 as a combined carrier and light-sensitive material, and as a light-sensitizing agent for the polyvinyl cinnamate, a triphenylmethane dye selected from those having the general structure

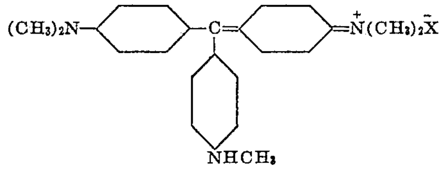

wherein X is a halogen atom, and the carbinol form of said dye.

12. A photomechanical resist composition comprising the ester of polyvinyl alcohol set forth in claim 1 as a combined carrier and light-sensitive material, and as a light-sensitizing agent for the polyvinyl cinnamate, a triphenylmethane dye selected from those having the general structure

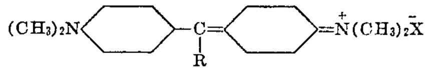

wherein X represents an acid group and R represents a member of the group consisting of phenyl, 4 - dimethylaminophenyl, 3 - carboxyphenyl, 2 - chlorophenyl, 4-phenylazo-salicylic acid, 4-phenylaminonaphthyl, 4-methylaminophenyl and 4-aminophenyl groups, and the carbinol form of said dye.

13. A photographic element comprising a support having thereon a layer comprising a partially esterified light-sensitive cinnamic acid ester of polyvinyl alcohol consisting of from 60 to 99.4 mol percent of recurring structural units having the formula $$-CH_2-\overset{|}{C}H-O-CO-CH{=}CH-R$$

wherein R represents a member of the class consisting of phenyl, m-nitrophenyl and o-chlorophenyl groups, the remaining recurring units being vinyl alcohol structural units.

14. A photographic element comprising a support having thereon a layer comprising a partially esterified light-sensitive cinnamic acid ester of polyvinyl alcohol consisting of from 60 to 99.4 mol percent of recurring structural units having the formula $$-CH_2-\overset{|}{C}H-O-CO-CH{=}CH-C_6H_5$$

the remaining recurring units being vinyl alcohol structural units.

15. A photomechanical resist composition comprising as a combined carrier and light-sensitive material a partially esterified cinnamic acid ester of polyvinyl alcohol consisting of from 60 to 99.4 mol percent of recurring structural units having the formula $$-CH_2-\overset{|}{C}H-O-CO-CH{=}CH-R$$

wherein R represents a member of the class consisting of phenyl, m-nitrophenyl, and o-chlorophenyl groups, the remaining recurring units being vinyl alcohol structural units, and a triphenylmethane dye as a light-sensitizing agent for the cinnamic acid ester.

References Cited in the file of this patent

UNITED STATES PATENTS

| Number | Name | Date |
|---|---|---|
| 1,241,738 | Klatte et al. | Oct. 2, 1917 |
| 1,587,270 | Beebe et al. | June 1, 1926 |
| 1,655,127 | Beebe | Jan. 3, 1928 |
| 1,880,808 | Clarke et al. | Oct. 4, 1932 |
| 1,963,074 | Carothers | June 19, 1934 |
| 1,965,710 | Murray | July 10, 1934 |
| 2,063,348 | Seymour | Dec. 8, 1936 |
| 2,118,864 | Reppe et al. | May 31, 1938 |
| 2,273,891 | Pollack et al. | Feb. 24, 1942 |
| 2,318,959 | Muskat | May 11, 1943 |
| 2,332,896 | D'Alelio | Oct. 26, 1943 |
| 2,544,905 | Van Deusen | Mar. 13, 1951 |

FOREIGN PATENTS

| Number | Country | Date |
|---|---|---|
| 512,914 | Great Britain | Sept. 28, 1939 |

OTHER REFERENCES

Plastics, February 1948, page 82.